United States Patent [19]
Jung

[11] Patent Number: 5,894,449
[45] Date of Patent: Apr. 13, 1999

[54] EQUALIZATION SIGNAL GENERATOR FOR SEMICONDUCTOR MEMORY DEVICE

[75] Inventor: Tae-Hyung Jung, Cheongju, Rep. of Korea

[73] Assignee: LG Semicon Co., Ltd., Cheongju, Rep. of Korea

[21] Appl. No.: 08/915,567

[22] Filed: Aug. 21, 1997

[30] Foreign Application Priority Data

Apr. 12, 1997 [KR] Rep. of Korea ............... 97-13546

[51] Int. Cl.$^6$ ............................................. G11C 8/00
[52] U.S. Cl. ................... 365/233.5; 365/202; 365/233
[58] Field of Search ....................... 365/233, 233.5, 365/202, 203; 327/172, 34, 36, 38

[56] References Cited

U.S. PATENT DOCUMENTS

| | | | |
|---|---|---|---|
| 4,630,239 | 12/1986 | Reed | 365/233.5 |
| 5,374,894 | 12/1994 | Fong | 327/14 |
| 5,672,989 | 9/1997 | Jang | 327/143 |

*Primary Examiner*—Son Mai
*Attorney, Agent, or Firm*—Fleshner & Kim

[57] ABSTRACT

An equalization signal generator generates an equalization signal having a constant pulse width. The constant pulse width prevents an equalization timing shortage from occurring due to a singly applied address transition detecting signal. The present invention prevents the pulse width of the equalization signal from being wider than required resulting from a plurality of overlapped address transition detection signals by decreasing a pulse width of the equalization signal to thereby enhance a semiconductor memory chip operating speed.

18 Claims, 8 Drawing Sheets

FIG.3A BACKGROUND ART  ATD0

FIG.3B BACKGROUND ART  ATD1

FIG.3C BACKGROUND ART  ATD2

FIG.3D BACKGROUND ART  ATDS

FIG.3E BACKGROUND ART  DEL

FIG.3F BACKGROUND ART  EQ

FIG.4A BACKGROUND ART  ATD0

FIG.4B BACKGROUND ART  ATD1 — LOW

FIG.4C BACKGROUND ART  ATD2 — LOW

FIG.4D BACKGROUND ART  ATDS

FIG.4E BACKGROUND ART  DEL

FIG. 7A ATD0

FIG. 7B ATD1

FIG. 7C ATD2

FIG. 7D A

FIG. 7E B  LOW

FIG. 7F C  LOW

FIG. 7J ATDS

FIG. 7K DEL

FIG. 7L EQ

EQUALIZATION SIGNAL GENERATOR FOR SEMICONDUCTOR MEMORY DEVICE

BACKGROUND OF THE INVENTION

1. Field of the Invention

The present invention relates to a memory device and more particularly to an equalization signal generator for a semiconductor memory device.

2. Background of the Related Art

Figure 1:
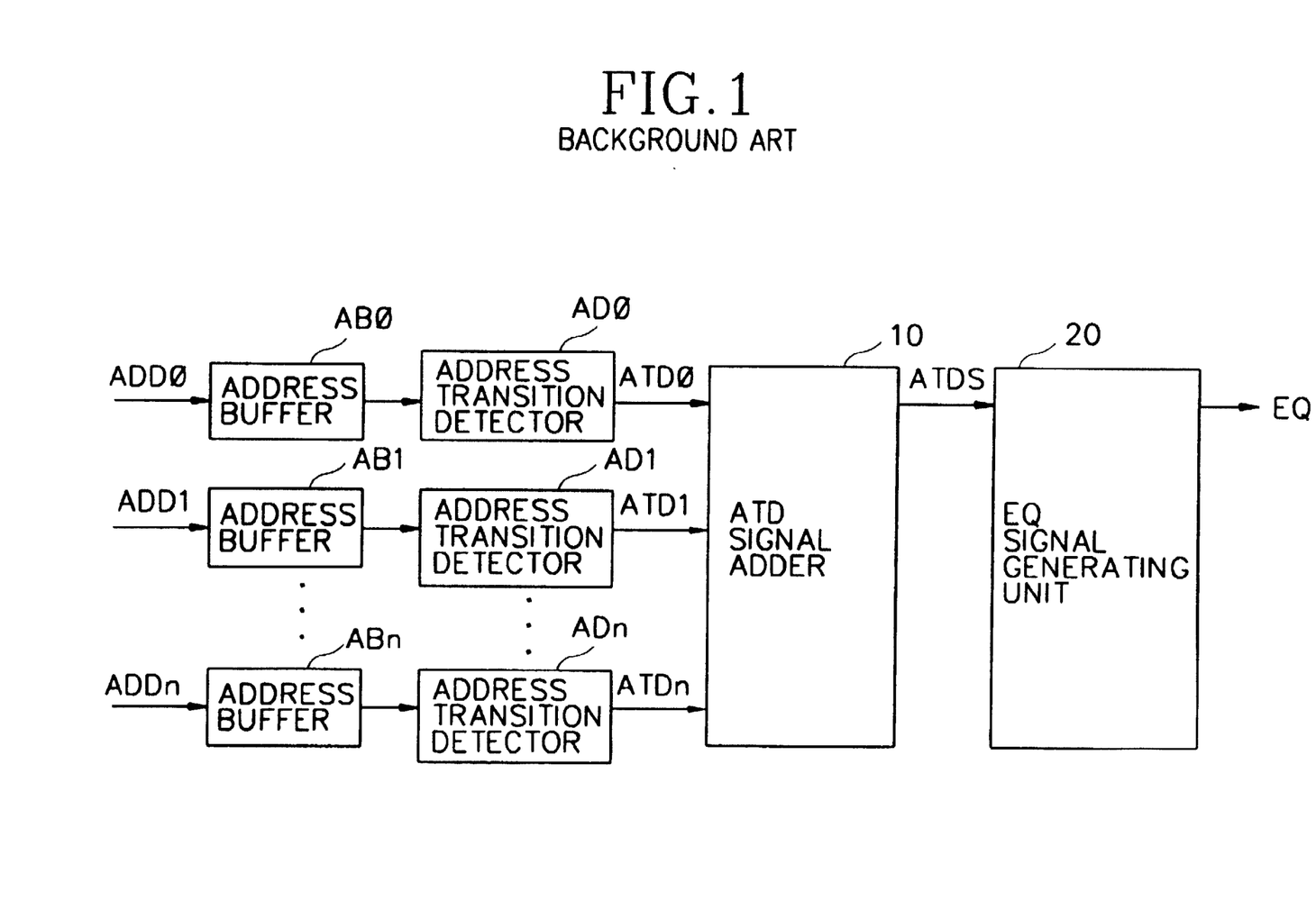
FIG. 1 is a block diagram of a related art equalization signal generator.

As shown in FIG. 1, a related art equalization signal generator includes a plurality of address buffers AB0, . . . ,ABn and address transition detectors AD0–ADn, and address transition detection (ATD) signal adder 10, and an equalization signal generating unit 20. A corresponding one of the plurality of address buffers AB0–ABn respectively receives a corresponding one of a plurality of address signals ADD0–ADDn. The plurality of address transition detectors AD0–ADn receives signals outputted from the address buffers AB0–ABn. The address transition detection (ATD) signal adder 10 sums respective address transition detection signals ATD0–ATDn from address transition detectors AD0–ADn. The equalization signal generating unit 20 receives a signal ATDS outputted from the adder 10 and outputs an equalization signal EQ.

Figure 2:
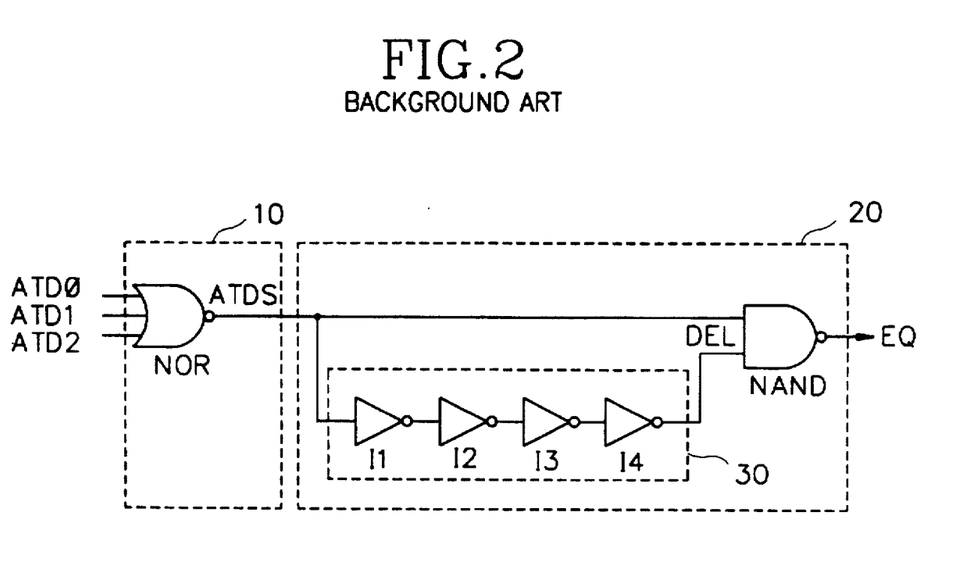
FIG. 2 is a detailed circuit diagram showing an address transition detection signal adder and an equalization signal generating unit of FIG. 1.

FIG. 2 illustrates a detailed stricture of the address transition detection signal adder 10 and the equalization signal generating unit 20 in the equalization signal generator of FIG. 1. Three address signals ADD0, ADD1, ADD2 will be selected from the plurality of address signals ADD0–ADDn for convenience.

As shown, the address transition detecting signal adder 10 includes a NOR gate for NORing the address transition detection signals ATD0, ATD1, ATD2 and outputting the address transition detection signal ATDS. The equalization signal generator 20 includes a delay unit 30 having a plurality of serially connected inverters I1–In for delaying the signal ATDS outputted from the address transition detection signal adder 10, and a NAND gate for NANDing a delayed signal DEL outputted from the delay unit 30 and the signal ATDS outputted from the address transition detection signal adder 10.

Figure 3A:
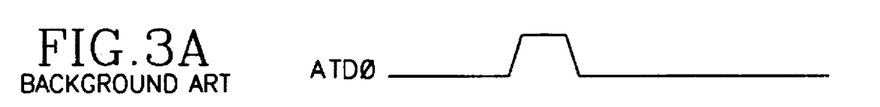
FIGS. 3A through 3F are timing diagrams of respective signals in the circuit of FIG. 1.
Figure 3B:
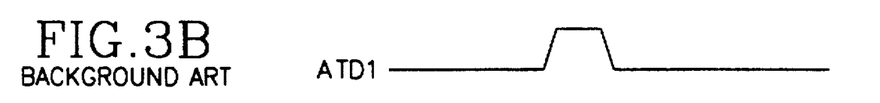
Figure 3C:
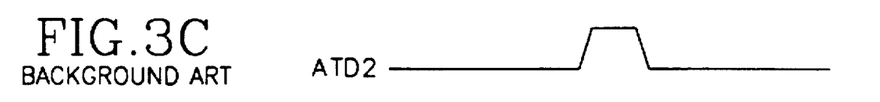
Figures 3D, 3E:
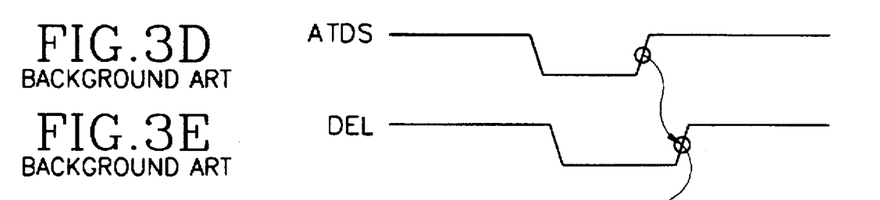

As shown in FIGS. 3A through 3C, the respective address transition detection signals ATD0, ATD1, ATD2 are NORed in the NOR gate of the adder 10, and the signal ATDS is outputted from the NOR gate as shown in FIG. 3E. At this time, when at least one of the address transition detection signals ATD0, ATD1, ATD2 is at a high level, the signal ATDS is rendered to be a low level. In order to render the signal ATDS to be a high level, the applied address transition detection signals ATD0, ATD1, ATD2 should be at a low level.

Figure 3F:
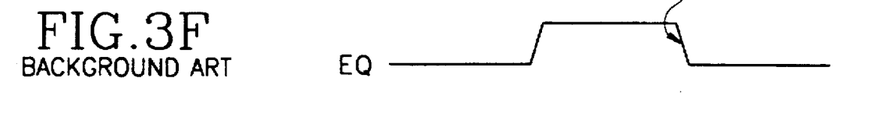

The signal ATDS is applied to the delay unit 30 and the NAND gate in the equalization generating unit 20 for outputting the equalization signal EQ, as shown in FIG. 3F. Because the size of the transistors in the inverters I1–I4 are different, the delay signal DEL serving as an output signal of the delay unit 30 is delayed for a longer time when the signal ATDS applied to the delay unit 30 is turned from a low level to a high level than when the signal ATDS is turned from a high level to a low level.

Therefore, when the signal ATDS is turned from a high level to a low level, the delay signal DEL is rendered to be a low level as shown in FIG. 3E. When the signal ATDS is turned from a low level to a high level, the equalization signal EQ remains at a high level due to the longer delay of the ATDS signal through the delay unit 30 for appropriately carrying out an equalization operation.

Figure 4A:
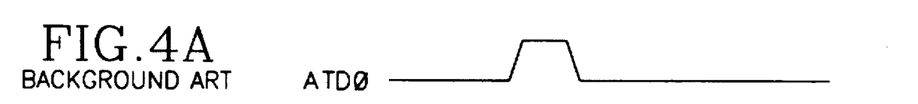
FIGS. 4A through 4F are modified timing diagrams of the respective signals in the circuit of FIG. 1.
Figure 4B:
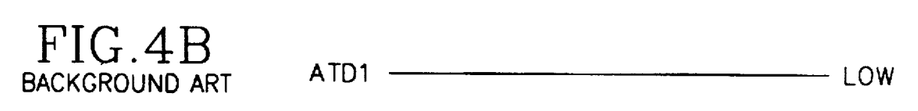
Figure 4C:
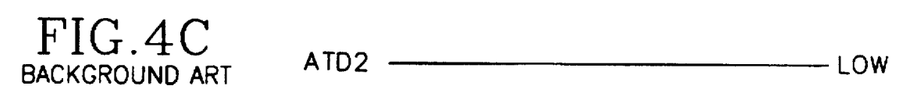
Figure 4D:
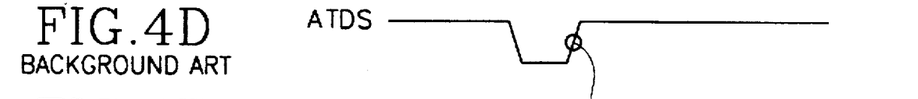
Figure 4E:
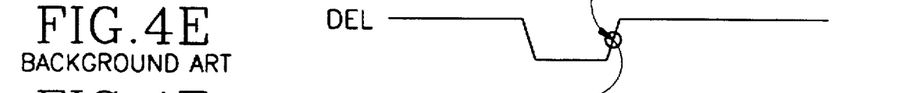
Figure 4F:
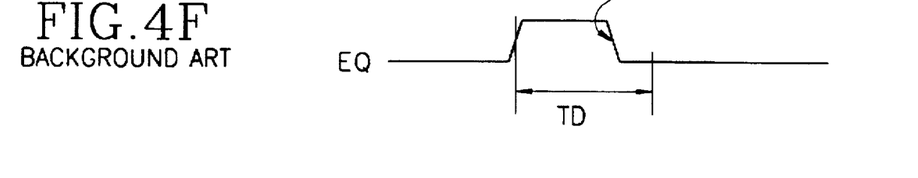

However, as shown in FIGS. 4A through 4C, when a pulse width of the equalization signal is decreased in order to accomplish a faster semiconductor chip operation, and although a single address transition detection signal is applied, a sufficient pulse width TD is not secured as shown in FIG. 4F, whereby a normal equalizing operation may not be properly carried out. Further, when a plurality of address transition detection signals are applied, the pulse width of the equalization signal becomes unnecessarily wide, thereby resulting in an abnormal chip operation.

SUMMARY OF THE INVENTION

Accordingly, it is an object of the present invention to provide an equalization signal of a constant pulse width.

Another object of the present invention is to prevent abnormal operation of the memory device or chip.

A further object of the present invention is to enhance an operational speed of a semiconductor memory device or chip.

To achieve such objects, advantages and/or features, there is provided an equalization signal generator which includes an address transition detecting signal generation unit for outputting a plurality of address transition detection signals, an address transition detection signal adder for adding the address transition detection signals and outputting an addition signal, and an equalization signal generating unit for receiving the addition signal outputted from the address transition detecting signal adder, outputting an equalization signal, and feeding back the equalization signal to the address transition detection signal adder.

The present invention may be achieved in a part or in whole by a signal generator for generating a signal of a prescribed pulse width including an address transition detecting unit that detects transitions of a plurality of address signals and generates a plurality of first output signals; an address transition detecting adder having a plurality of transmission units, each transmission unit receiving a corresponding first output signal and coupled to a first logic gate to output a second output signal; and a signal generating unit coupled to the address transition detecting adder for receiving the second output unit from the first logic unit to generate the signal of the prescribed pulse width.

The present invention may be achieved in a part or in a whole by an address transition detection signal adder coupled to receive a plurality of address transition detection signals from a plurality of address transition detectors to output a first output signal to a equalization signal generating unit, the address transition detection signal adder includes a plurality of transmission units, each coupled to receive a corresponding address transition detection signal and a signal from the equalization signal generating unit; and a first logic gate coupled to receive an output signal from the plurality of transmission units.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 5:
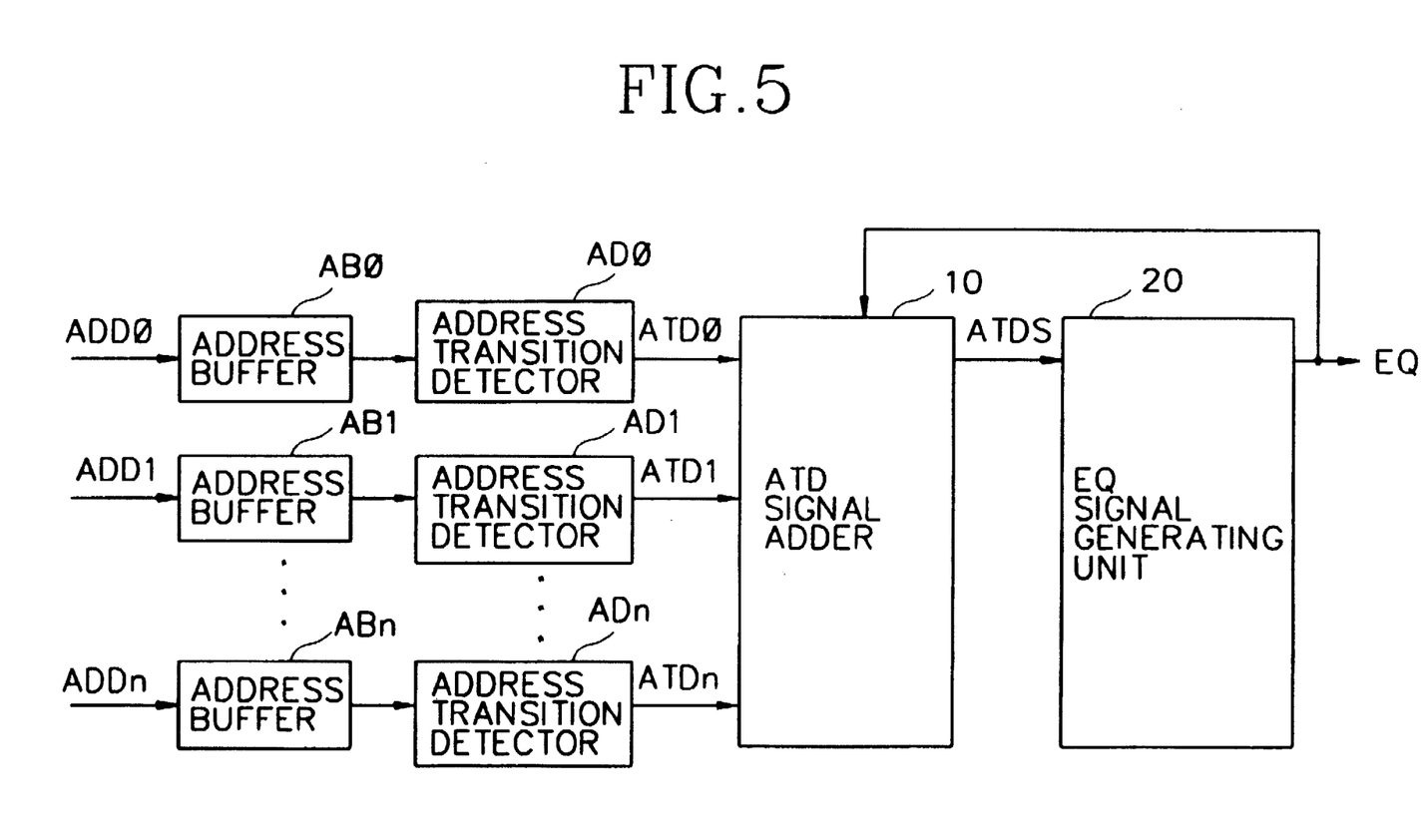
FIG. 5 is a block diagram of an equalization signal generator according to a first embodiment of the present invention.

As shown in FIG. 5, an equalization signal generator according to the present invention includes a plurality of address buffers AB0–ABn and address transition detectors AD0–ADn, an address transition detection signal adder 10 and an equalization signal generating unit 20. A corresponding one of the plurality of address buffers AB0–ABn receives a corresponding one of a plurality of address signals ADD0–ADDn. The plurality of address transition detectors AD0–ADn respectively receives and detects transitions in the buffered signals outputted from the corresponding address buffers AB0–ABn. The address transition detection signal adder 10 sums respective address transition detection signals ATD0–ATDn from detectors AD0–ADn. The equalization signal generating unit 20 receives an address transistor detection signal ATDS outputted from the adder 10 and outputs and feeds back to the address transition detection signal adder 10 an equalization signal EQ.

Figure 6:
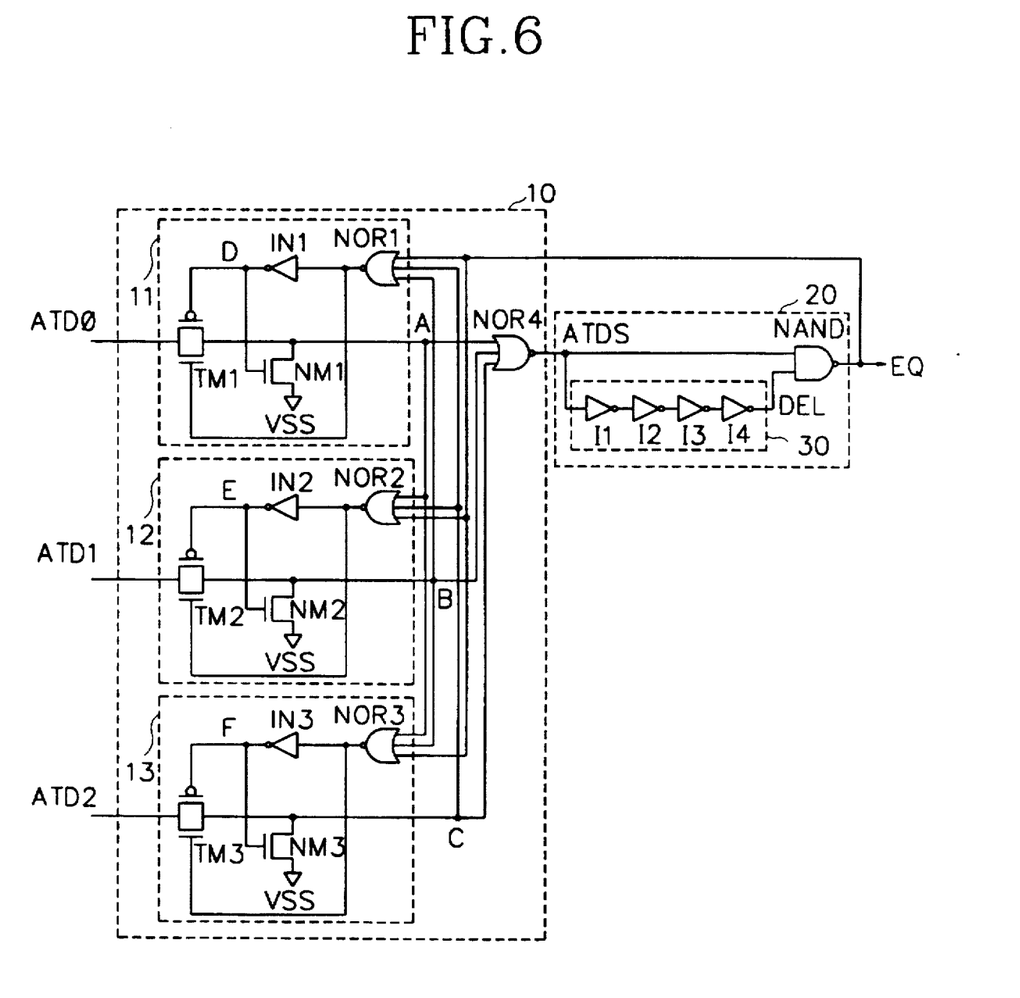
FIG. 6 is a schematic circuit diagram of an address transition detection signal adder and an equalization signal generating unit in the circuit of FIG. 5.

FIG. 6 illustrates the address transition detection signal adder 10 and the equalization signal generator 20 in FIG. 3. The address transition detecting signal adder 10 includes first, second and third transmission units 11, 12 and 13, which are connected to a NOR gate NOR4. The first transmission unit 11 includes a NOR gate NOR1 for NORing respective signals outputted from the second and third transmission units 12, 13 and the EQ signal outputted from the equalization signal generating unit 20. An inverter IN1 inverts an output signal of the NOR gate NOR1 and a transmission gate TM1 is controlled by respective output signals of the inverter IN1 and the NOR gate NOR1. An NMOS transistor NM1 has a gate connected to receive the output signal from the inverter IN1, the drain connected to the output of transmission gate TM1 and the source connected to a ground voltage Vss. The second and third transmission units 12, 13 are identical in structure to the first transmission unit 11 and description thereof is omitted.

The equalization signal generator 20 includes a delay unit 30 having a plurality of serially connected inverters I1, I2, I3, I4 provided therein so as to delay the signal ATDS outputted from the address transition detection signal adder 10. A NAND gate NANDs a delay signal DEL outputted from the delay unit 30 and the signal ATDS outputted from the address transition detection signal adder 10.

The operation of the thusly constituted equalization signal generator according to the present invention will now be described with reference to the accompanying drawings. Here, three address signals ADD0, ADD1, ADD2 selected from the plurality of address signals ADD0.....ADDn, and four selected inverters I1, I2, I3, I4 will be described for convenience.

Figure 7A:
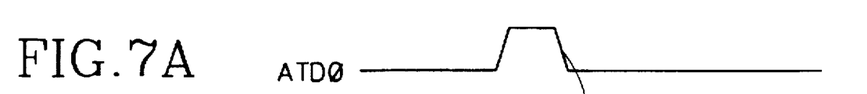
FIGS. 7A through 7L are timing diagrams of respective signals in the circuit of FIG. 6.
Figure 7B:
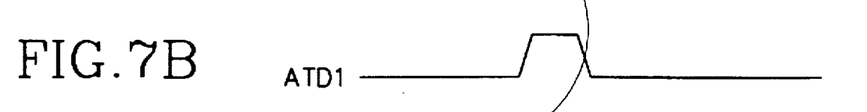
Figure 7C:
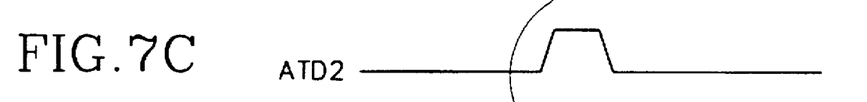
Figure 7D:
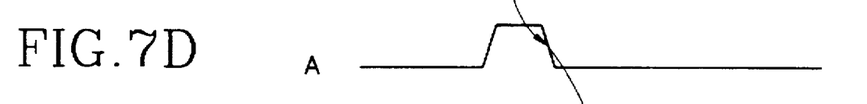
Figure 7E:
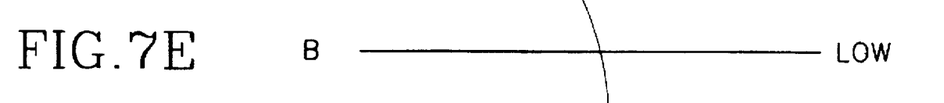
Figure 7F:
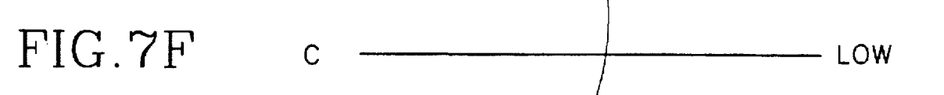
Figure 7G:
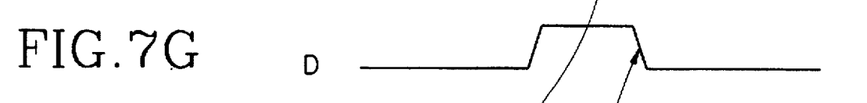
Figure 7H:
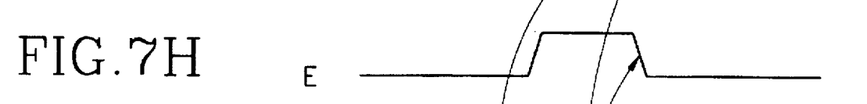

As shown in FIGS. 7A through 7C, when the first address transition detection signal ATD0 out of the address transition detecting signals ATD0, ATD1, ATD2 is initially applied, a node A in the first transmission unit 11 is turned to a high potential, which is applied to nodes E, F respectively through a corresponding one of the gates NOR2, NOR3 and a corresponding one of the second and the third inverters IN2, IN3. The nodes E, F are rendered to high potentials and turn off the transmission gates TM2, TM3 which respectively receive the address transition detection signals ATD1, ATD2. Therefore, the nodes B, C are turned to low potentials.

Figure 7I:
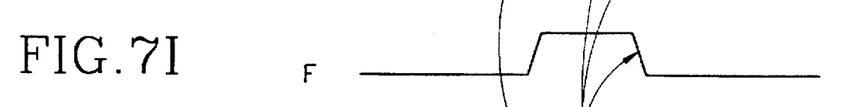
Figure 7J:
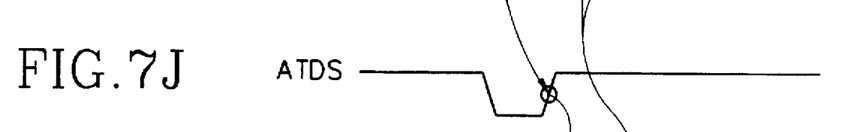
Figure 7K:
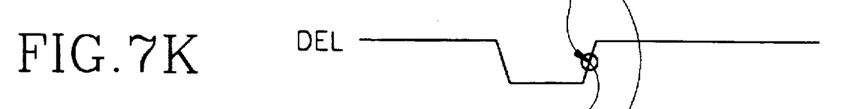
Figure 7L:
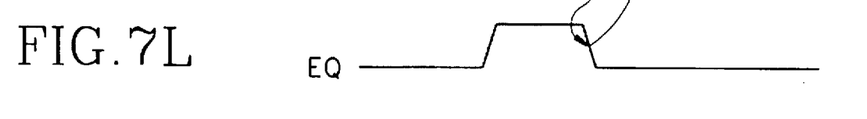

When the node A is turned to a high potential, and because the nodes B, C remain at low potentials, the signal ATDS outputted from the NOR gate NOR4 becomes a low potential as shown in FIG. 7J. In the meantime, the signal ATDS is delayed by the delay unit 30 to output the delay signal DEL. The signal ATDS and the delay signal DEL are NANDed in the NAND gate and as shown in FIG. 7I, the NANDed resultant signal is outputted as the equalization signal EQ. At this time, as the signal ATDS is at a low level, the equalization signal EQ is turned to a high level.

The equalization signal EQ is fed back to the address transition detection signal adder 10 to thereby convert the nodes D, E, F to high potential. Therefore, the node A is turned to a low potential, and the signal ATDS is turned to a high level. At this time, the delay signal DEL is instantly turned to a low level when the signal ATDS is turned to a low level in accordance with the characteristic of the inverters in the delay unit 30. The signal ATDS is turned to a high level after a longer delay time. Therefore, the delay of the delay unit 30 determines the pulse width of the equalization signal EQ. That is to say, the pulse width of the equalization signal EQ is determined by the time period from the point when the signal ATDS is turned to a low level and when the delay signal DEL is turned to a high level.

Figure 8:
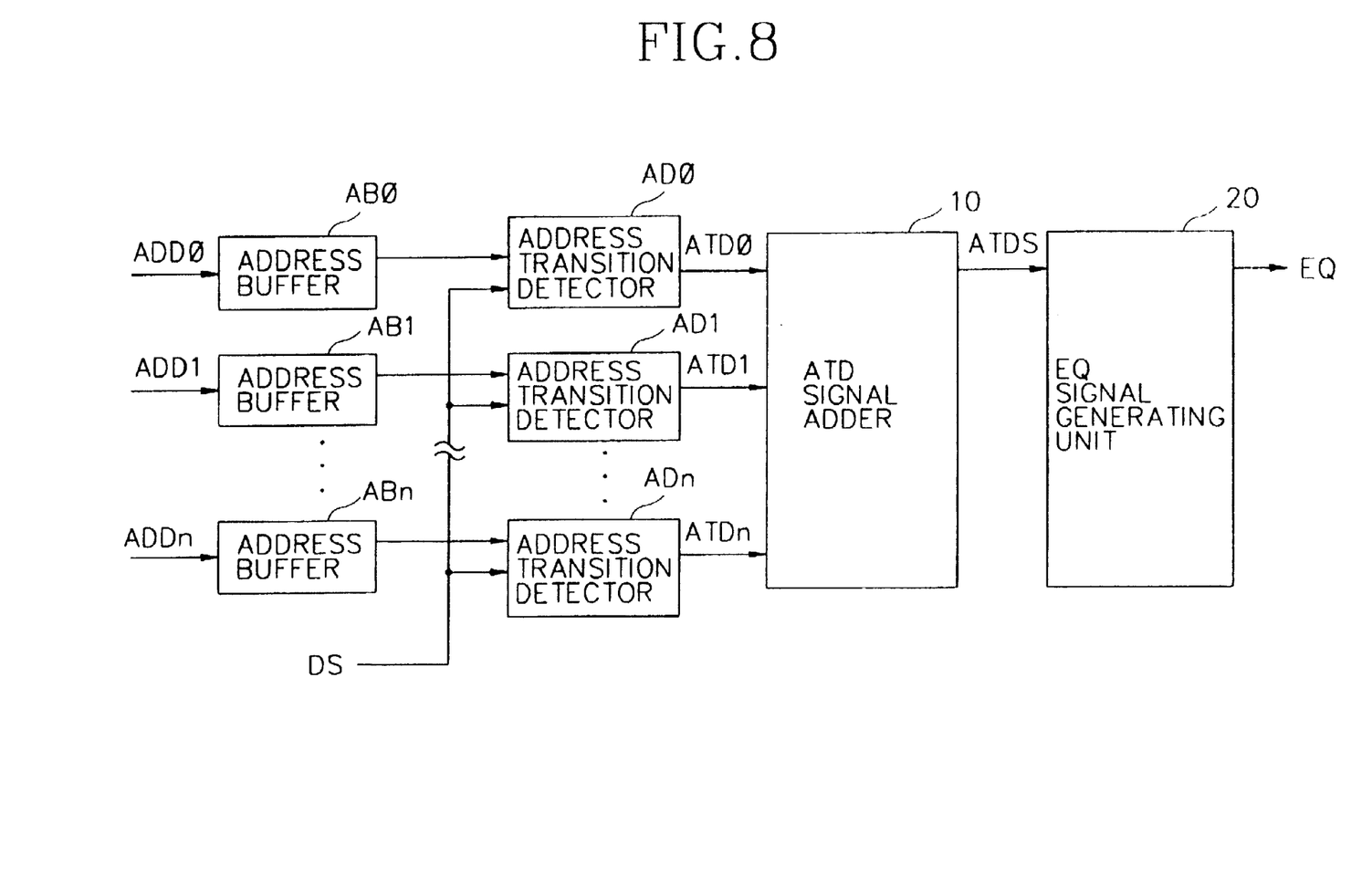
FIG. 8 is a block diagram of an equalization signal generator according to a second embodiment of the present invention.

FIG. 8 illustrates an equalization signal generator according to the second embodiment of the present invention. The generator includes a plurality of address buffers AB0–ABn for respectively receiving a corresponding one of a plurality of address signals ADD0–ADDn; a plurality of address transition detectors AD0–ADn for respectively receiving the buffered signals outputted from corresponding ones of the address buffers AB0–ABn, being controlled by an externally applied disable signal DS, and outputting the address transition detection signals ATD0–ATDn; an address transition detection signal adder 10 for adding the respective signals ATD0–ATDn; and an equalization signal generating unit 20 for receiving a signal ATDS outputted from the adder 10, and outputting an equalization signal EQ.

Figure 9:
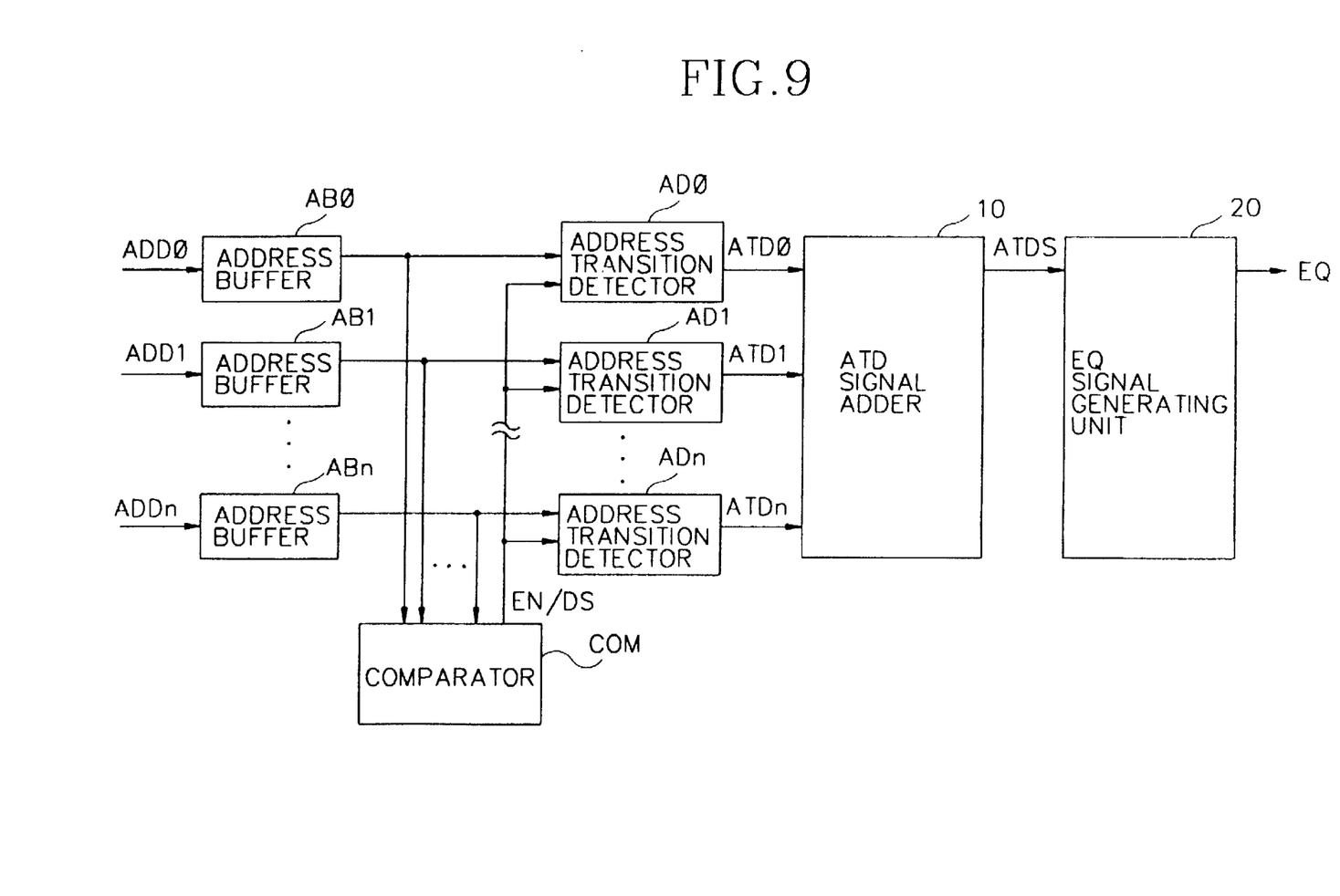
FIG. 9 is a block diagram of an equalization signal generator according to a third embodiment of the present invention.

FIG. 9 illustrates an equalization signal generator according to the third embodiment of the present invention. The generator includes a plurality of address buffers AB0–ABn for respectively receiving a corresponding one of a plurality of address signals ADD0–ADDn; a comparator COM for receiving the buffered address signals ADD0–ADDn outputted from the respective address buffers AB0–ABn; a plurality of address transition detectors AD0–ADn controlled by an enable/disable signal EN/DS outputted from the comparator COM, for receiving the respective buffered address signals from corresponding ones of the address buffers AB0–ABn and outputting respective address transition detection signals ATD0–ATDn; an address transition detection signal adder 10 for adding the respective detection signals ATD0, . . . ,ATDn; and an equalization signal generating unit 20 for receiving a signal ATDS outputted from the adder 10 and outputting an equalization signal EQ in accordance therewith.

As described above, the equalization signal generator according to the present invention generates an equalization signal having a constant pulse width. The constant pulse width prevents an equalization timing shortage from occurring due to a singly applied address transition detecting signal. The present invention prevents the pulse width of the equalization signal from being wider than required resulting from a plurality of overlapped address transition detecting signals by decreasing a pulse width of the equalization signal to thereby enhance a semiconductor memory chip operating speed.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An equalization signal generator for a memory chip, comprising:

a address transition detection signal generating unit for receiving and detecting transitions in a plurality of address signals and outputting a corresponding plurality of address transition detection signals;

an address transition detection signal adder for adding the address transition detection signals and outputting an output signal; and an equalization signal generating unit for receiving the output signal outputted from the address transition detection signal adder, outputting an equalization signal, and feeding back the equalization signal to the address transition detection signal adder.

2. The generator of claim 1, wherein the address transition detection signal adder comprises:

a plurality of transmission units each receiving a respective one of the address transition detection signals and said plurality of transmission units receiving the equalization signal; and a first logic gate for performing a first logical operation on signals outputted from the transmission units.

3. The generator of claim 2, wherein each of the plurality of transmission units comprises:

a second logic gate for performing a second logical operation on signals outputted from other transmission units and the equalization signal outputted from the equalization signal generating unit;

an inverter for inverting an output signal of the second logic gate;

a transmission gate for receiving a corresponding address transition detection signal and being controlled by respective output signals of the second logic gate and the inverter; and a first transistor having a control electrode coupled for receiving the output signal of the inverter, a first electrode coupled for receiving an output signal of the transmission gate, and a second electrode coupled for receiving a prescribed voltage.

4. The generator of claim 1, wherein the equalization signal generating unit comprises:

a delay unit having a plurality of serially connected delay elements for delaying the output signal outputted from the address transition detection signal adder; and a first gate for performing a logical operation on a delay signal outputted from the delay unit and the output signal outputted from the address transition detection signal adder, and outputting the equalization signal to the address transition detection signal generating unit.

5. The generator of claim 4, wherein a pulse width of the equalization signal is determined in accordance with a delay rate of the delay unit.

6. The generator of claim 4, wherein transition edges of the equalization signal is based on a transition edge of the output signal from said address transition detection signal adder and a transition edge of an output signal from said delay unit.

7. The generator of claim 3, wherein said first logic gate and said second logic gate are NOR-gates and said first transistor is an NMOS transistor.

8. A signal generator for generating a signal of a prescribed pulse width, comprising:

an address transition detecting unit that detects transitions of a plurality of address signals and generates a plurality of first output signals;

an address transition detecting adder having a plurality of transmission units, each transmission unit receiving a corresponding first output signal and coupled to a first logic gate to output a second output signal; and a signal generating unit coupled to said address transition detecting adder for receiving the second output signal from said first logic unit to generate the signal of the prescribed pulse width.

9. The signal generator of claim 8, wherein the signal of the prescribed pulse width feeds back from said signal generating unit to said first logic gate of said address transition detecting adder.

10. The signal generator of claim 8, wherein said signal generating unit comprises:

a delay unit receiving the second output signal such that a delayed second output signal is generated; and a second logic gate having a first input coupled for receiving the second output signal and a second input coupled for receiving the delayed second output signal such that the signal of the prescribed pulse width is generated.

11. The signal generator of claim 10, wherein the prescribed pulse width is based on a transition edge of the second output signal and a transition edge of the delayed second output signal.

12. The signal generator of claim 11, wherein the transition edge of the second output signal is a leading edge, and the transition edge of the delayed second output signal is a trailing edge.

13. The signal generator of claim 10, wherein said delay unit comprises a plurality of inverters and said first logic gate is a NOR gate, and said second logic gate is a NAND gate.

14. The signal generator of claim 9, wherein each of said plurality of transmission units comprises:

a second logic gate having inputs that receives the second output signal from other transmission units and the signal of the prescribed pulse width;

a third logic gate coupled to said second logic gate;

a transmission gate, coupled to receive a corresponding first output signal and responsive to outputs from said second and third logic gates to provide the corresponding first output signal to said first logic gate; and a transistor having a control electrode and first and second electrodes, the control electrode being coupled to said third logic gate, the first electrode being coupled to said first logic gate and the second electrode being coupled to a prescribed potential.

15. The signal generator of claim 14, wherein said first and second logic gates are NOR-gates, said third logic gate is an inverter, said transistor is an NMOS transistor and the prescribed potential is a ground potential.

16. An address transition detection signal adder coupled to receive a plurality of address transition detection signals from a plurality of address transition detectors to output a first output signal to an equalization signal generating unit, said address transition detection signal adder comprises:

a plurality of transmission units, each coupled to receive a corresponding address transition detection signal and a signal from the equalization signal generating unit; and a first logic gate coupled to receive an output signal from said plurality of transmission units.

17. The address transition detection signal adder of claim 16, wherein each of said plurality of transmission units comprises:

a second logic gate having inputs that receives the output signal from other transmission units and the signal from the equalization signal generating unit;

a third logic gate coupled to said second logic gate;

a transmission gate, coupled to receive a corresponding address transition detection signal and responsive to outputs from said second and third logic gates to provide the output signal to said first logic gate; and a transistor having a control electrode and first and second electrodes, the control electrode being coupled to said third logic gate, the first electrode being coupled to said first logic gate and the second electrode being coupled to a prescribed potential.

18. The address transition detection signal adder of claim 17, wherein said first and second logic gates are NOR-gates, said third logic gate is an inverter, said transistor is an NMOS transistor and the prescribed potential is a ground potential.

* * * * *